United States Patent [19]

Landseadel

[11] Patent Number: 4,906,876
[45] Date of Patent: Mar. 6, 1990

[54] BASE DRIVE CIRCUIT

[75] Inventor: Bradley A. Landseadel, Hoffman Estates, Ill.

[73] Assignee: MSI Corporation, Barrington, Ill.

[21] Appl. No.: 262,317

[22] Filed: Oct. 25, 1988

[51] Int. Cl.$^4$ .......................... H03K 17/60; H03K 3/42
[52] U.S. Cl. ..................................... 307/570; 307/571; 307/311; 307/253; 307/639
[58] Field of Search ............... 307/570, 571, 311, 253, 307/639

[56] References Cited

U.S. PATENT DOCUMENTS

| | | | |
|---|---|---|---|
| 4,037,117 | 7/1977 | Carbrey | 307/253 |
| 4,710,645 | 12/1987 | Doittau et al. | 307/571 |

FOREIGN PATENT DOCUMENTS

| | | | |
|---|---|---|---|
| 0100823 | 6/1985 | Japan | 307/253 |
| 0230425 | 10/1986 | Japan | 307/571 |

Primary Examiner—Andrew J. James
Assistant Examiner—Margaret Rose Wambach
Attorney, Agent, or Firm—Thomas R. Vigil

[57] ABSTRACT

The base drive circuit is used to drive a bipolar power switching device of the type which includes a collector, a base and an emitter (or equivalents thereto). The drive circuit includes first and second electronic switches. The first electronic switch is coupled between the collector and the base of the power switching device. The second electronic switch is coupled between the base of the power switching device and a negative voltage source which is negative with reference to the emitter voltage. The first electronic switch has a gate and the second electronic switch has a gate and both gates are connected together. A resistor is coupled between the gates of the first and second switches and a positive voltage source. A control electronic switch is connected between the gates and the negative voltage source, the electronic control switch being responsive to a control input signal. A reference voltage bus is connected between a voltage potential intermediate said positive and negative voltages and the emitter of the power switching device. The first switch is conductive and fully enhanced when a positive voltage is applied to the gate thereof and the second switch is conductive and fully enhanced when a negative voltage is applied to the gate thereof.

10 Claims, 1 Drawing Sheet

BASE DRIVE CIRCUIT

BACKROUND OF THE INVENTION

1. Field of the Invention

The present invention relates to a base drive circuit for driving a bipolar electronic power switching device, such as a NPN transistor.

2. Description of the Prior Art

Heretofore various drive circuits have been proposed for driving a bipolar electronic switching device, such as an NPN or PNP transistor.

In order to prevent driving the electronic power switching device, i.e., a power transistor, into saturation and to ensure a smooth "turn on" and "shut off" of the power transistor, various circuit arrangements have been proposed.

One such circuit arrangement is called a "Baker Clamp" and is a network of diodes which are connected between a drive circuit and the collector, base and emitter of the power driven transistor and which have predetermined voltage drops thereacross to prevent saturation of the transistor, to provide effective reverse bias of the base-emitter junction to turn off the transistor and to provide predetermined voltage drops between the collector and the base and between the collector and the emitter of the driven transistor.

The present invention differs from the previously proposed circuit arrangements including a drive circuit and a "Baker Clamp" by providing a drive circuit comprising first and second electronic switching devices connected between the collector, base and emitter of an electronic power switching device, such as a power transistor, and a source of negative voltage, a source of positive voltage and an input trigger switch device.

SUMMARY OF THE INVENTION

According to the invention there is provided a base drive circuit for driving a bipolar power switching device of the type which includes a collector, a base and an emitter (or equivalents thereto) to quasi saturature but not full saturature, the drive circuit comprising: first and second electronic switches, said first electronic switch being coupled between the collector and the base of the power switching device thereby to prevent the base-collector voltage from exceeding the collector-emitter voltage to prevent saturation of said bipolar power switching device, said second electronic switch being coupled between the base of the power switching device and a negative voltage source which is negative with reference to the emitter voltage, said first electronic switch having a gate and said second electronic switch having a gate, the gates of said switches being connected together; impedance means coupled between said gates of said first and second switches and a positive voltage source; a control electronic switch connected between said gates and said negative voltage source, said electronic control switch being responsive to a control input signal, and a reference voltage bus is connected between a voltage potential intermediate said positive and negative voltages and the emitter of the power switching device, said first switch being conductive and fully enhanced when a positive voltage is applied to the gate thereof and said second switch being conductive and fully enhanced when a negative voltage is applied to the gate thereof.

BRIEF DESCRIPTION OF THE DRAWINGS

The single figure, FIG. 1, of the drawings is a schematic circuit diagram of the base drive circuit of the present invention.

DESCRIPTION OF THE PREFERRED EMBODIMENT

Figure 1:
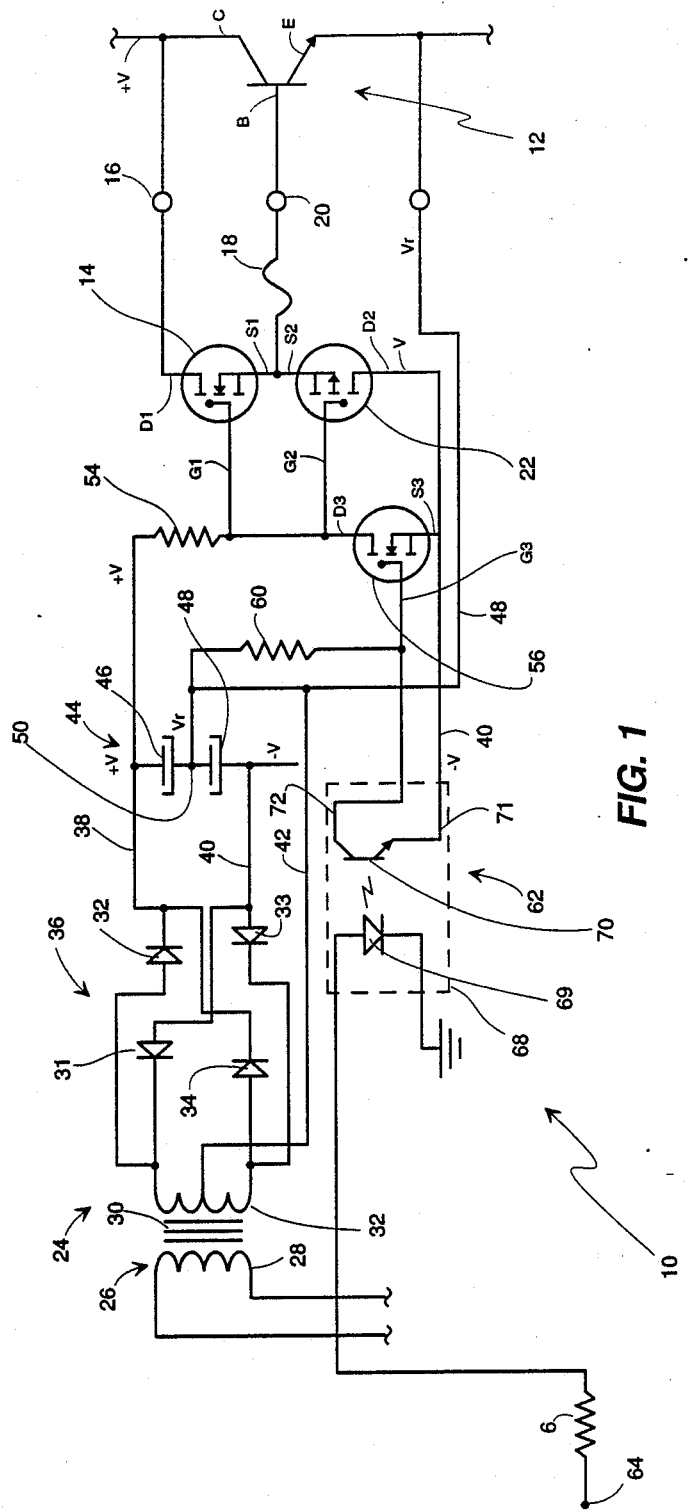

Referring now to the drawings in greater detail, there is shown in the figure, FIG. 1, of the drawings a base drive circuit 10 for driving an electronic power switching device 12 which in the illustrated embodiment is a NPN power transistor 1. This transistor includes a collector C, a base or gate B and an emitter E.

According to the teachings of the present invention, the base drive circuit 10 includes a first electronic switching device 14 which is realized by an N channel enhancement mode MOSFET 14 which is coupled between the collector C and the gate B of the power transistor 12. The MOSFET 14 includes a drain D1, a source S1 and a gate G1. The drain D1 is connected to a terminal 16 connected to the collector C and the source S1 is connected through a fuse 18 to a terminal 20 connected to the base B.

The base drive circuit 10 further includes a second electronic switching device 22 which is a P channel enhancement mode MOSFET 22 having a source S2, a gate G2 and a drain D2. The source S2 is also connected through the fuse 18 to the base B of the power transistor 12.

The drive circuit 10 additionally includes a power supply 24 which, in the illustrated embodiment, is realized by a transformer 26 including a primary winding 28, a core 30 and a secondary winding 32. The primary winding 28 is supplied with a source of AC power. The transformer 26 provides an isolated power source for the base drive circuit 10.

The power supply further includes a four diode 31–34 rectifier circuit 36 which is coupled to the secondary winding 32 of the transformer 26 in a bridge arrangement and which provides +12 volts DC to a positive voltage output bus 38 and a −12 volts DC to a negative voltage output bus 40. Also, a reference (or zero) voltage bus 42 is connected to the middle of the secondary winding 32 as shown.

The output of the rectifier circuit 36 is coupled to a voltage storing and filtering capacitor circuit 44 comprising a first filtering and storing capacitor 46 and a second filtering and storing capacitor 48 which are coupled in series between the +12 volt DC bus 38 and the −12 volt DC bus 40, as shown.

Also, the reference bus 42 is coupled to a junction 50 between the two capacitors 46 and 48, as shown.

As shown, the reference bus 42 is adapted to be coupled to the emitter E of the power transistor through a terminal 52.

The +12 volt bus 38 is coupled through a pull up resistor 54 to the gate G1 of the first MOSFET 14 and to the gate G2 of the second MOSFET 22. The gates G1 and G2 are also coupled to a control electronic switching device 56 which forms part of the device circuit 10 and which can be realized by an N channel enhancement mode MOSFET 56 that has a drain D3, a source S3 and a gate G3. The gates G1 and G2 of the MOSFET 14 and 22 are connected to the drain D3 of the MOSFET 56. The source S3 is coupled to the −12 volt bus 40 that is also coupled to the drain D2 of the second MOSFET 22.

Another or second pull up resistor 60 is connected between the reference voltage bus 42 (junction 50 between the capacitors 46 and 48) and the gate G3 of the third (control) MOSFET 56 and form part of a trigger input circuit 62 of the drive circuit 10 to the control MOSFET 56. The circuit 62 comprises an input terminal 64, a third dropping resistor 66 and an optical coupler 68. The resistor 60 is coupled between the input terminal 64 and the optical coupler 68. As shown, the optical coupler 68 includes a light emitting diode (LED) 69 and a photosensitive transistor 70 having a collector 71 coupled to the pull up resistor 60 and the gate 63 of the control electronic switch or third MOSFET 56 and an emitter 72 coupled to the −12 volt. Typically, the input signal to the input terminal 64 of the trigger input circuit 62 is a constant frequency variable duty cycle pulse train.

In the operation of the base drive circuit 10, when the input pulse signal goes high, the light emitting diode 69 is energized to send an optical (light) signal to the photosensitive transistor 70 to render same conductive to place the third MOSFET not enhanced.

Prior to this time, the control switching device (third MOSFET) 56 is forward biased, enhanced, and in a conducting state so as to short circuit the gates G1 and G2 to the negative voltage bus 40. This places a negative voltage (−12 volt DC) on the gate G1 of the first MOSFET 14 so as to place that MOSFET 14 in a reverse biased, non-enhanced, nonconducting state. At the same time, the negative voltage at the gate G2 places the second MOSFET 22 in a forward biased, enhanced, conducting state. As a result, the second MOSFET 22 is reverse biased, non-enhanced, and a negative current is urged to flow from the drain D2 to the gate G2 and prevent conducting of the second MOSFET 22.

Then, when the input signal goes high and the photosensitive transistor 70 is turned on and conducting the voltage of the gate G3 goes low to −12 volts and the control electronic switch (third MOSFET) 56 is reverse biased, or non-enhanced, and turned off (rendered nonconducting). This causes the voltage at the gates G1 and G2 to rise to the +12 volts DC on the positive bus 38 by reason of the open circuit now created between the gates G1 and G2 and the drain D2 of the second MOSFET 22. The first MOSFET 14 is then forward biased, enhanced, causing it to conduct and short circuit the connection between the drain D1 and the source S1, thereby placing the voltage of +12 volts, at the collector C on the base B of the power transistor 12.

It is to be noted that the voltage supplied from the +12 volt bus 38 through the pull up resistor 54 to the gate Gl of the first MOSFET 14 caused the first MOSFET 14 to become fully enhanced thereby to supply the +12 volt voltage at the collector C to the base B of the power transistor 12 so that the power transistor 12 is quasi saturated and conductive.

At the same time, the second P channel enhancement mode MOSFET 22 not enhanced so as to create an open circuit between the source S2 and the drain D2 such that the voltage between the base B and emitter E is the voltage between the positive bus 38, namely +12 volts DC, and the reference voltage, Vr, which is approximately 0 volts.

The optical coupler 68 provides for optical coupling and isolation between the input signal at the input terminal 64 and the Gate G3.

From the foregoing description, it will be apparent that the base drive circuit lo the present invention provides for efficient and effective energization of a bipolar NPN power transistor with effective forward and reverse biasing of the power transistor without driving it into saturation so as to obtain effective and efficient driving or energization of the power transistor.

Also, it will be apparent from the foregoing description that the base drive circuit 10 the present invention has a number of advantages, some of which have been described above, and others of which are inherent in the invention. Further, it will be apparent that modifications can be made to the base drive circuit of the present invention without departing from the teachings of the invention. Accordingly, the scope of the invention is only to be limited as necessitated by the accompanying claims.

I claim:

1. A base drive circuit for driving a bipolar power switching device of the type which includes a collector, a base and an emitter (or equivalents thereto) to quasi saturation but not full saturation, the drive circuit comprising: first and second electronic switches, said first electronic switch being coupled between the collector and the base of the power switching device thereby to prevent the base-collector voltage from exceeding the collector-emitter voltage to prevent saturation of said bipolar power switching device, said second electronic switch being coupled between the base of the power switching device and a negative voltage source which is negative with reference to the emitter voltage, said first electronic switch having a gate and said second electronic switch having a gate, the gates of said switches being connected together; impedance means coupled between said gates of said first and second switches and a positive voltage source; a control electronic switch connected between said gates and said negative voltage source, said electronic control switch being responsive to a control input signal, and a reference voltage bus is connected between a voltage potential intermediate said positive and negative voltages and the emitter of the power switching device, said first switch being conductive and fully enhanced when a positive voltage is applied to the gate thereof and said second switch being conductive and fully enhanced when a negative voltage is applied to the gate thereof.

2. The base drive circuit of claim 1 wherein said first electronic switch has a collector emitter sustaining voltage rating equal to that of the driven power transistor.

3. The base drive circuit of claim 1 wherein said first electronic switch is a field effect transistor having a drain and source as well as a gate.

4. The base drive circuit of claim 1 wherein said second electronic switch is a field effect transistor having a drain and source as well as a gate.

5. The base drive circuit of claim 1 wherein said first electronic switch is an N channel enhancement mode MOSFET.

6. The base drive circuit of claim 1 wherein said second electronic switch is a P channel enhancement mode MOSFET.

7. The base drive circuit of claim 1 wherein said control switch means is a field effect transistor.

8. The base drive circuit of claim 1 wherein said control switch means is an N channel enhancement mode MOSFET.

9. The base drive circuit of claim 1 including a trigger input circuit comprising an input terminal and an optical coupler between said input terminal and the gate of said control switch means.

10. The base drive circuit of claim 1 including a power supply comprising a transformer, a rectifying diode bridge circuit and a capacitor filtering and energy storing circuit which provides said positive, negative and reference voltage sources.

* * * * *